(12) United States Patent
Lai et al.

(10) Patent No.: US 11,199,742 B2
(45) Date of Patent: Dec. 14, 2021

(54) DISPLAY DEVICE AND DRIVING METHOD THEREOF

(71) Applicants: BOE TECHNOLOGY GROUP CO., LTD., Beijing (CN); ORDOS YUANSHENG OPTOELECTRONICS CO., LTD., Inner Mongolia (CN)

(72) Inventors: Wei Lin Lai, Beijing (CN); Guanyin Wen, Beijing (CN); Zhengyin Xu, Beijing (CN); Chien Pang Huang, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 708 days.

(21) Appl. No.: 16/072,791

(22) PCT Filed: Dec. 15, 2017

(86) PCT No.: PCT/CN2017/116461
§ 371 (c)(1),
(2) Date: Jul. 25, 2018

(87) PCT Pub. No.: WO2018/153147
PCT Pub. Date: Aug. 30, 2018

(65) Prior Publication Data
US 2021/0165273 A1    Jun. 3, 2021

(30) Foreign Application Priority Data
Feb. 22, 2017   (CN) .......................... 201710096263.0

(51) Int. Cl.
*G02F 1/1335* (2006.01)
*H01L 27/32* (2006.01)
*H01L 51/52* (2006.01)

(52) U.S. Cl.
CPC .. *G02F 1/133553* (2013.01); *G02F 1/133514* (2013.01); *G02F 1/133618* (2021.01);
(Continued)

(58) Field of Classification Search
CPC ......... G02F 1/133553; G02F 1/133514; G02F 1/133618; H01L 51/5215; H01L 51/5234; H01L 27/3232
See application file for complete search history.

(56) References Cited

U.S. PATENT DOCUMENTS

| 8,471,500 B2 * | 6/2013 | Fletcher | H05B 45/12 |
| | | | 315/308 |
| 2003/0142244 A1 * | 7/2003 | Kato | G02F 1/133553 |
| | | | 349/61 |

(Continued)

FOREIGN PATENT DOCUMENTS

| CN | 101004505 A | 7/2007 |
| CN | 101806962 A | 8/2010 |

(Continued)

OTHER PUBLICATIONS

International Search Report and Written Opinion dated Mar. 26, 2016; PCT/CN2017/116461.

*Primary Examiner* — Donald L Raleigh

(57) ABSTRACT

A display device includes a sub-pixel unit, the sub-pixel unit includes: a reflective liquid crystal display unit with a reflective display region, including a liquid crystal layer and a reflective layer; and a electroluminescent display unit with a light-emitting display region, wherein the light-emitting display region is overlapped with the reflective display (Continued)

region; wherein the reflective layer and the electroluminescent display unit are located on both sides of the liquid crystal layer respectively.

16 Claims, 7 Drawing Sheets

(52) U.S. Cl.
CPC ...... *H01L 27/3232* (2013.01); *H01L 51/5215* (2013.01); *H01L 51/5234* (2013.01)

(56) References Cited

U.S. PATENT DOCUMENTS

| | | | | |
|---|---|---|---|---|
| 2003/0193457 | A1* | 10/2003 | Wang | G09G 3/20 345/84 |
| 2006/0164577 | A1 | 7/2006 | Lim et al. | |
| 2006/0262242 | A1* | 11/2006 | Koma | G02F 1/1336 349/69 |
| 2010/0156282 | A1 | 6/2010 | Park et al. | |
| 2017/0206857 | A1 | 7/2017 | Li | |
| 2017/0317151 | A1* | 11/2017 | Miyake | H01L 27/3265 |
| 2018/0053917 | A1* | 2/2018 | Isaka | G02F 1/133602 |
| 2018/0114489 | A1* | 4/2018 | Tan | G09G 3/3406 |

FOREIGN PATENT DOCUMENTS

| | | | | |
|---|---|---|---|---|
| CN | 104157217 A | | 11/2014 | |
| CN | 105047143 A | | 11/2015 | |
| CN | 106324877 A | * | 1/2017 | ........... G09G 3/3258 |
| CN | 106873218 A | | 6/2017 | |

* cited by examiner

| In an indoor environment, controlling the first display unit to work and controlling the second display unit to work | ─ S1201 |

| In an outdoor environment, controlling the first display unit to work and controlling the second display unit to work or not | ─ S1202 |

DISPLAY DEVICE AND DRIVING METHOD THEREOF

The application claims priority to the Chinese patent application No. 201710096263.0, filed on Feb. 22, 2017, the entire disclosure of which is incorporated herein by reference as part of the present application.

TECHNICAL FIELD

At least one embodiment of the present disclosure relates to a display device and a driving method thereof.

BACKGROUND

With the rapid development of display technologies, conventional cathode ray tube displays have gradually faded out of the high-level display market due to their large size and severe radiation, and have been replaced by liquid crystal displays (LCD) which have characteristics such as low-radiation, low-power and light-weight. And the liquid crystal displays can be divided into transmissive, reflective, and transflective liquid crystal displays according to optical technology.

SUMMARY

At least one embodiment of the present disclosure provides a display device comprising a plurality of sub-pixel units, each of the plurality of sub-pixel units comprising: a reflective liquid crystal display unit with a reflective display region and including a liquid crystal layer and a reflective layer; and an electroluminescent display unit with a light-emitting display region, and the light-emitting display region being overlapped with the reflective display region; wherein, the reflective layer and the electroluminescent display unit are located on two sides of the liquid crystal layer respectively.

In an example, the reflective liquid crystal display unit further includes: a first substrate and a second substrate opposite to each other, wherein the liquid crystal layer is located between the first substrate and the second substrate; and a first driving electrode and a second driving electrode configured to control rotation of liquid crystal molecules in the liquid crystal layer; wherein the electroluminescent display unit is located on the first substrate and comprises a first electrode, a second electrode, and a light-emitting layer located between the first electrode and the second electrode.

In an example, the light-emitting display region of the electroluminescent display unit completely covers the reflective display region of the reflective liquid crystal display unit, and both the first electrode and the second electrode of the electroluminescent display unit are transparent electrodes.

In an example, a size of the reflective display region of the reflective liquid crystal display unit is substantially the same as a size of the light-emitting display region of the electroluminescent display unit.

In an example, the electroluminescent display unit is located between the first substrate and the liquid crystal layer, and one of the first electrode and the second electrode of the electroluminescent display unit serves as one of the first driving electrode and the second driving electrode of the reflective liquid crystal display unit.

In an example, the first substrate is located between the electroluminescent display unit and the liquid crystal layer.

In an example, the display device further comprises a cover plate located on a side of the electroluminescent display unit away from the liquid crystal layer.

In an example, at least a portion of the reflective display region of the reflective liquid crystal display unit is uncovered by the light-emitting display region of the electroluminescent display unit, and one of the first electrode and the second electrode of the electroluminescent display unit is a reflective electrode.

In an example, the other of the first driving electrode and the second driving electrode of the reflective liquid crystal display unit is a transparent electrode.

In an example, the reflective liquid crystal display unit further comprises a first color filter layer, and the electroluminescent display unit is configured to emit light of a first color, and the color filter layer has the first color.

In an example, the display device further comprises a control unit configured to selectively control the reflective liquid crystal display unit and the electroluminescent display unit to display.

In an example, the display device further comprises an ambient light detection unit configured to acquire a light intensity data signal of ambient light received by the display device, wherein the control unit is further configured to selectively control the reflective liquid crystal display unit and the electroluminescent display unit to display according to the light intensity data signal.

In an example, the control unit is further configured to control the reflective liquid crystal display unit and the electroluminescent display unit to display simultaneously in a case where the light intensity data signal is less than a first predetermined value, and display light emitted from the electroluminescent display unit having a first brightness; and control display light emitted from the electroluminescent display unit to have a second brightness in a case where the light intensity data signal is greater than a first predetermined value, the second brightness being less than the first brightness, and the first predetermined value being less than or equal to the second predetermined value.

In an example, the second brightness is substantially zero.

Another embodiment of the present disclosure provides a driving method of the display device according to any one of the embodiments, comprising: under illumination of a first ambient light, controlling the reflective liquid crystal display unit and the electroluminescent display unit to display simultaneously, and the display light emitted from the electroluminescent display unit having a first brightness; and under illumination of a second ambient light, controlling the electroluminescent display unit not to work or to emit display light with a second brightness, wherein, a light intensity of the first ambient light is less than a light intensity of the second ambient light.

In an example, the second brightness is less than the first brightness, and the second brightness is substantially not zero.

In an example, the first ambient light is indoor ambient light and the second ambient light is indoor ambient light.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Figure 1:
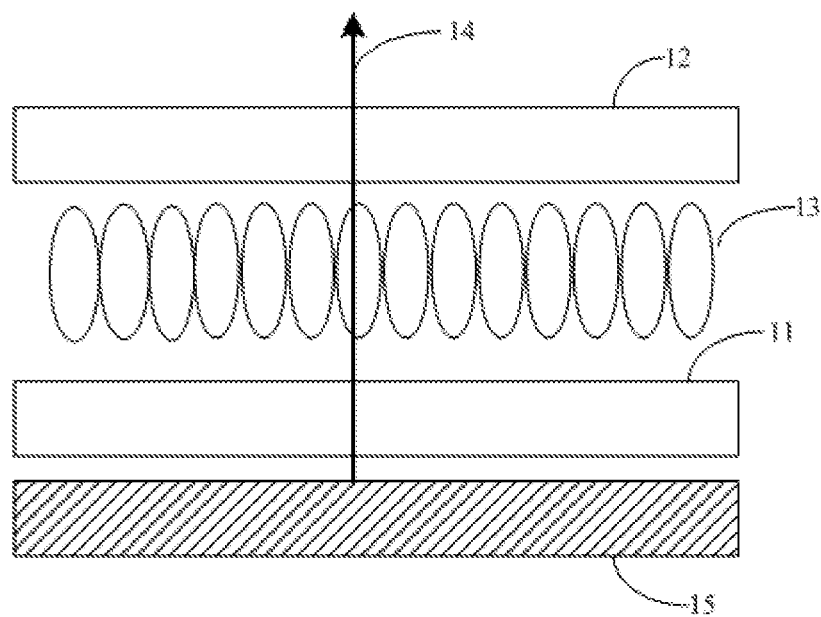
FIG. 1 is a schematic view illustrating a structure of a transmissive LCD.

As illustrated in FIG. 1, a transmissive LCD includes an array substrate 11 and a color filter substrate 12 disposed opposite to each other, and a liquid crystal layer 13 disposed between the array substrate 11 and the color filter substrate 12. Light 14 of the transmissive LCD comes from a backlight module 15.

Figure 2:
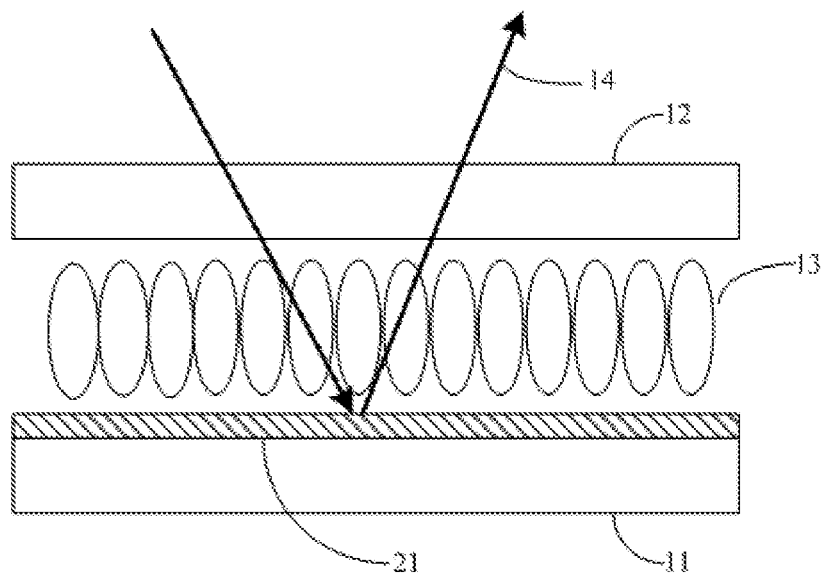
FIG. 2 is a schematic view illustrating a structure of a reflective LCD.

As illustrated in FIG. 2, a reflective LCD includes an array substrate 11 and a color filter substrate 12 disposed opposite to each other, a liquid crystal layer 13 located between the array substrate 11 and the color filter substrate 12, and a reflective layer 21 disposed on the array substrate. The reflective layer 21 is configured to reflect an ambient light 14. Display light 14 of the reflective LCD is from an external light reflected by the reflective layer 21.

Light of a transflective LCD is partly from a backlight module and partly from an external light. An LCD whose light from the backlight module has a better brightness and a better image quality, but consumes more power. An LCD whose light from an external light can fully use the ambient light, have greatly reduced power consumption, but have a poor brightness and a poor image quality.

Figure 3:
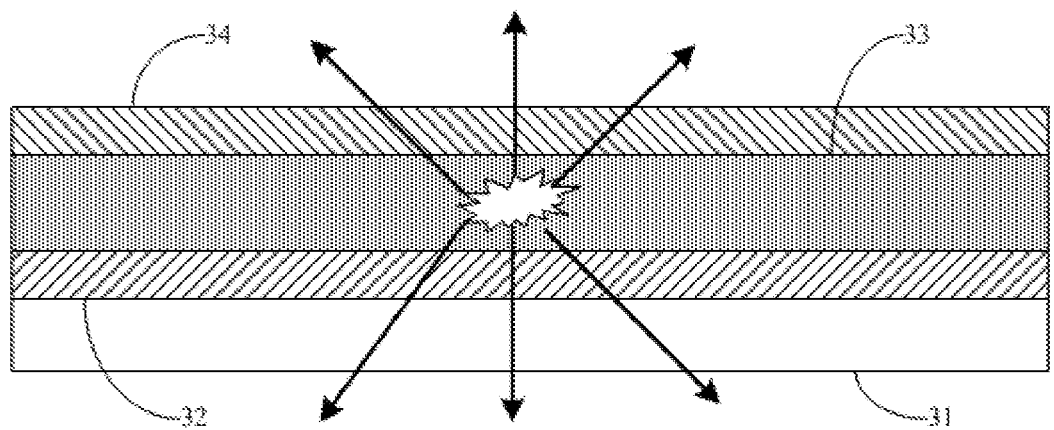
FIG. 3 is a schematic view illustrating a structure of an organic light-emitting diode display.

Organic light-emitting diode (OLED) is regarded as one of the most promising flat display technologies following LCD, and is also called organic electroluminescent display. Its light-emitting principle is similar to that of a light-emitting diode which also utilizes light-emitting characteristics of the material, while the material of the OLED is an organic substance. As illustrated in FIG. 3, an OLED includes a back plate 31, an anode 32 disposed on the back plate 31, a light-emitting layer 33 disposed on the anode 32, and a cathode 34 disposed on the light-emitting layer 33. A direction of an arrow in the figure refers to a direction of light emitted from the light-emitting layer 33. OLEDs have the advantages of active light emission, high response speed, and the like.

However, as to transmissive LCDs and OLEDs which are often used as display screens for mobile products, the displayed image can be clearly viewed in indoors; but in sunny outdoors, the displayed image of transmissive LCDs and OLEDs may be difficult to be viewed and recognized by human eyes due to excessive ambient light. The current common solution is to increase the brightness of the display to facilitate viewing, but this solution will cause the display to increase power consumption and will accelerate the decay of service life of the display.

The embodiments of the present disclosure provide a display device and a driving method thereof to reduce the power consumption of the display and prolong the service life of the display when the ambient light is strong.

An embodiment of the present disclosure provides a display device including a plurality of sub-pixel units. Each of the plurality of sub-pixel units includes:

a reflective liquid crystal display unit having a reflective display region and including a liquid crystal layer and a reflective layer; and an electroluminescent display unit having a light-emitting display region, and the light-emitting display region being overlapped with the reflective display region;

wherein, the reflective layer and the electroluminescent display unit are located on two sides of the liquid crystal layer respectively.

Hereinafter, an array substrate provided by an embodiment of the present disclosure will be described in detail with reference to the accompanying drawings.

The thickness, area size and shape of each layer in the drawings do not reflect real scale of the layer, and the purpose is only to illustrate the present disclosure.

Figure 4:
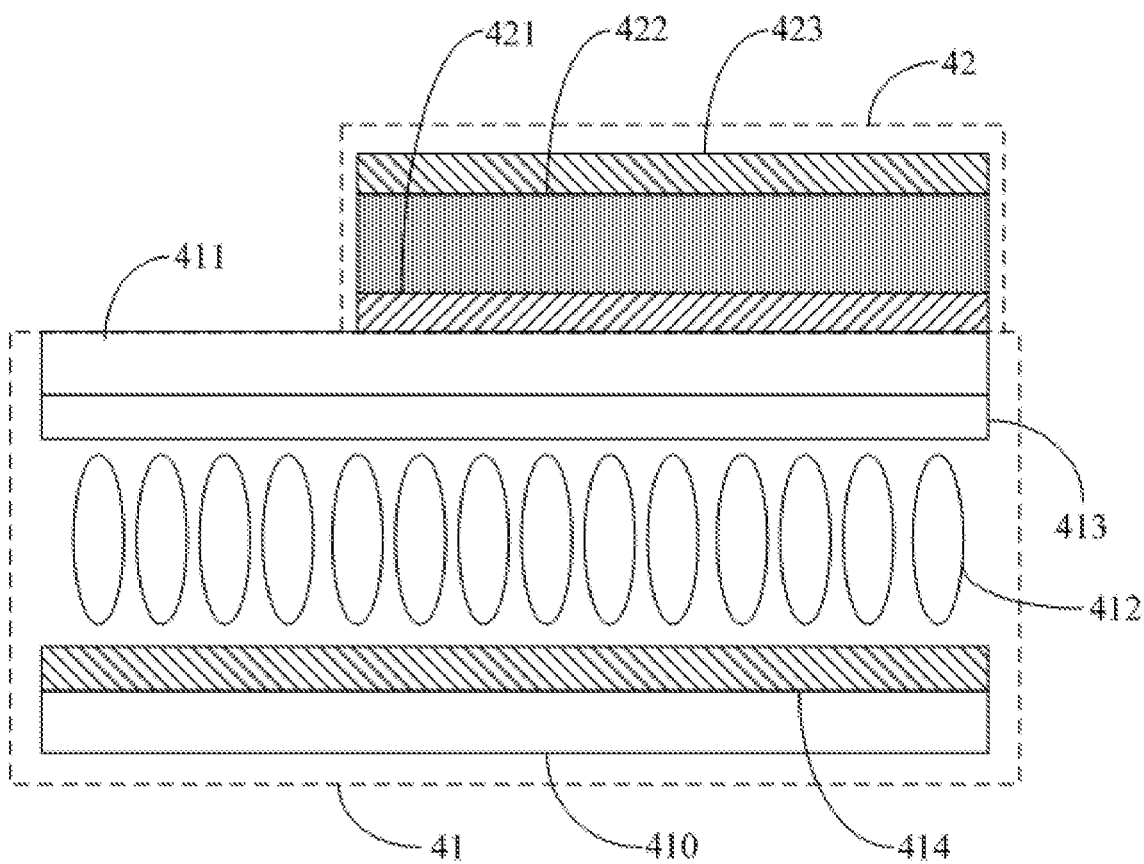
FIG. 4 is a schematic view illustrating a structure of a display device according to an embodiment of the present disclosure.

As illustrated in FIG. 4, an embodiment of the present disclosure provides a display device including a plurality of sub-pixel units. Each of plurality of sub-pixel units includes a first display unit 41 and a second display unit 42 located on the first display unit 41.

The first display unit 41 includes an array substrate 410 and a first substrate 411 disposed opposite to each other, liquid crystal molecules 412 disposed between the array substrate 410 and the first substrate 411, and a transparent electrode 413 disposed on a side of the first substrate 411 closer to the liquid crystal molecules 412, and a reflective layer electrode 414 located on a side of the array substrate 410 closer to the liquid crystal molecules 412.

The transparent electrode 413 and the reflective layer electrode 414 are configured to adjust rotation of the liquid crystal molecules 412.

The second display unit 42 includes a first electrode 421 located on a predetermined region of the first substrate 411 away from the liquid crystal molecules 412, an organic light-emitting layer 422 located on the first electrode 421, and a second electrode 423 located on the organic light-emitting layer 422.

When the display device provided by the embodiment of the present disclosure is placed in an indoor environment, because the external light is relatively weak, the display device adopts the second display unit as the main display light source, and the external light serves as an auxiliary display light source. The external light is reflected by the reflective layer electrode, and passes through the liquid crystal molecules with different rotation degrees to display. When the display device provided by the embodiment of the present disclosure is placed in an outdoor environment, the relatively strong external light can be adopted as a main display light source in this case, and the second display unit serves as an auxiliary display light source. The external light is reflected by the reflective layer electrode, and then passes through the liquid crystal molecules with different rotation degrees to display. In this case, the external light can be effectively used to reduce the power consumption of the display device and prolong the service life of the display. Simultaneously, unfavorable issues for human eye's difficulty in identifying caused by strong external light can be solved.

For example, the first display unit in the embodiment of the present disclosure is a reflective liquid crystal display unit; the second display unit is an electroluminescent display unit, for further example, is an organic electroluminescent display unit.

In the above embodiment, the electrode layer 414 in the reflective liquid crystal display unit 41 serves as a driving electrode for controlling the rotation of liquid crystal molecules in the liquid crystal layer 412 on the one hand, and serves as a reflective layer on the other hand. However, it can be understood that in another embodiment, the reflective liquid crystal display unit 41 can be provided with a reflective layer different from the driving electrode.

For example, in an embodiment of the present disclosure, the first display unit is a reflective liquid crystal display unit with fringe field in-plane rotation mode; or a reflective liquid crystal display unit with twisted nematic mode; or a reflective liquid crystal display unit with vertical alignment mode; or a reflective liquid crystal display unit with advanced super-dimensional field switching mode.

In an embodiment of the present disclosure, the second display unit is a double-sided-emitting organic electroluminescent display unit, or a top-emitting organic electroluminescent display unit, or a bottom-emitting organic electroluminescent display unit.

The configuration of the second display unit in the embodiment of the present disclosure will be described in detail below with reference to the accompanying drawings.

The second display unit in the embodiment of the present disclosure is a double-sided-emitting organic electroluminescent display unit.

Figure 5A:
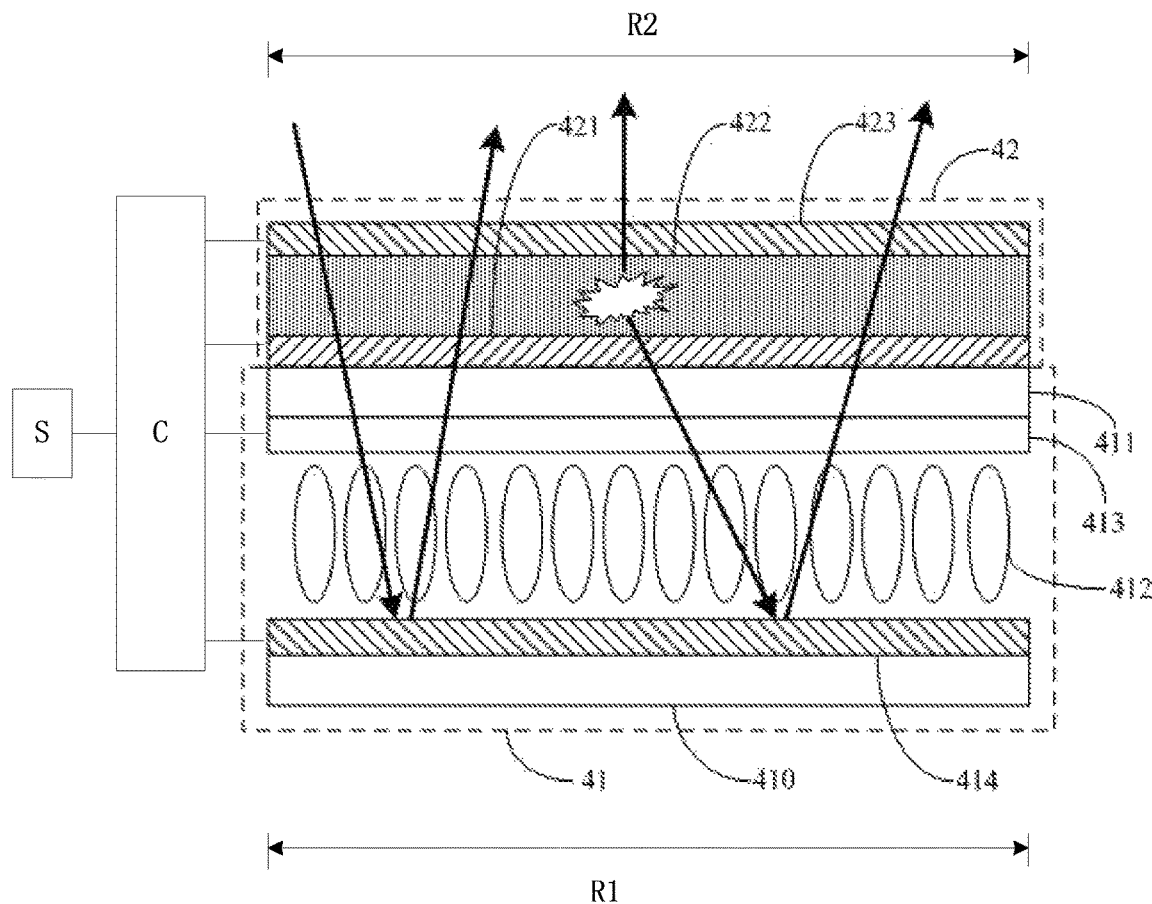
FIG. 5A is a schematic view illustrating a structure of a display device according to an embodiment of the present disclosure.

As illustrated in FIG. 5A, a reflective liquid crystal display unit 41 has a reflective display region R1. In the reflective display region R1, pattern displaying is performed by reflecting light from an outside of the reflective liquid crystal display unit 41.

The second display unit 42 has a light-emitting display region R2. In an embodiment of the present disclosure, the first electrode 421 is a transparent electrode, and the second electrode 423 is a transparent electrode. The second display unit in the embodiment of the present disclosure can perform double-sided light emission. For example, a material of the first electrode 421 is the same as the material of the second electrode 423, a single-layer film material such as indium tin oxide (ITO) or indium zinc oxide (IZO) can be selected, and a composite film material such as ITO and IZO can also be selected. In the actual production process, other types of transparent conductive materials can also be selected. The embodiments of the present disclosure do not limit the specific materials of the first electrode and the second electrode.

The reflective display region R1 of the reflective liquid crystal display unit 41 and the light-emitting display region R2 of the electroluminescent display unit 42 are overlapped with each other.

In the present embodiment, for example, the first substrate 411 is a glass substrate. For example, a thickness of the first substrate 411 is greater than 100 microns.

In this embodiment, the light-emitting display region R2 of the second display unit 42 completely covers the reflective display region R1 of the reflective liquid crystal display unit 41.

For example, a size of the light-emitting display region R2 of the second display unit 42 is substantially the same as that of the reflective display region R1 of the reflective liquid crystal display unit 41.

As illustrated in FIG. 5A, in an embodiment of the present disclosure, an area size of an orthographic projection of the first electrode 421 on the first substrate 411 is equal to that of the first substrate 411 on the first substrate 411; or an area size of an orthographic projection of the second electrode 423 on the first substrate 411 is equal to an area size of the first substrate 411. For example, the first electrode 421 and/or the second electrode 423 are/is discontinuous, separate electrodes. In an embodiment of the present disclosure, the first electrode 421 is a continuous electrode, and an area size of an orthographic projection of the first electrode 421 on the first substrate 411 is equal to an area size of the first substrate 411, or the second electrode 423 is a continuous electrode, and an area size of the orthographic projection of the second electrode 423 on the first substrate 411 is equal to an area size of the first substrate 411. In the actual production process, the area size of the orthographic projection of the first electrode 421 on the first substrate 411 in the embodiment of the present disclosure can also be different from the area size of the first substrate 411, and the area size of the orthographic projection of the second electrode 423 on the first substrate 411 can also be different from the area size of the first substrate 411.

As illustrated in FIG. 5A, when the display device is placed in an indoor environment, because an external environment light is relatively weak, light from the organic electroluminescent display unit is adopted as a main display light source, and light from the external environment is adopted as an auxiliary display light source. Due to the double-sided emission organic electroluminescent display unit, the light emitted from an upper side of the organic electroluminescent display unit can be directly received by the human eyes and can be used to display. The light emitted from a lower side of the organic electroluminescent display unit is reflected upward by the reflective layer electrode 414. The upward light passes through the liquid crystal molecules with different rotation degrees and is used to display. The light of the weak external environment is incident through the liquid crystal molecules 412 in the first display unit to the reflective layer electrode 414, which is also reflected upward by the reflective layer electrode, and the upward light passes through liquid crystal molecules with different rotation degrees to display. In this case, the light source can be used effectively and the power consumption of the display device can be reduced. A direction of an arrow in FIG. 5A refers to a light traveling direction.

As illustrated in FIG. 5A, when the display device is placed in an outdoor environment, because an external environment light is relatively strong in this case, light emitted from the organic electroluminescent display unit is adopted as an auxiliary display light source, and light from the external environment is adopted as a main display light source. The strong light from the external environment is incident on the reflective layer electrode 414 through the liquid crystal molecules 412 in the first display unit, and is reflected upwards by the reflective layer electrode. The upward light passes through the liquid crystal molecules with different rotation degrees and is used as the main display light source. The light from the organic electroluminescent display unit is adopted as an auxiliary display light source to adjust the brightness of the display device in cooperation with the main display light source. With this configuration, the strong light from outside can be effectively utilized, and the power consumption of the display device is reduced. At the same time, with this configuration, issues of difficulty in identifying caused by too bright external light can be solved, and energy is saved compared to in the indoor environment.

Figure 5B:
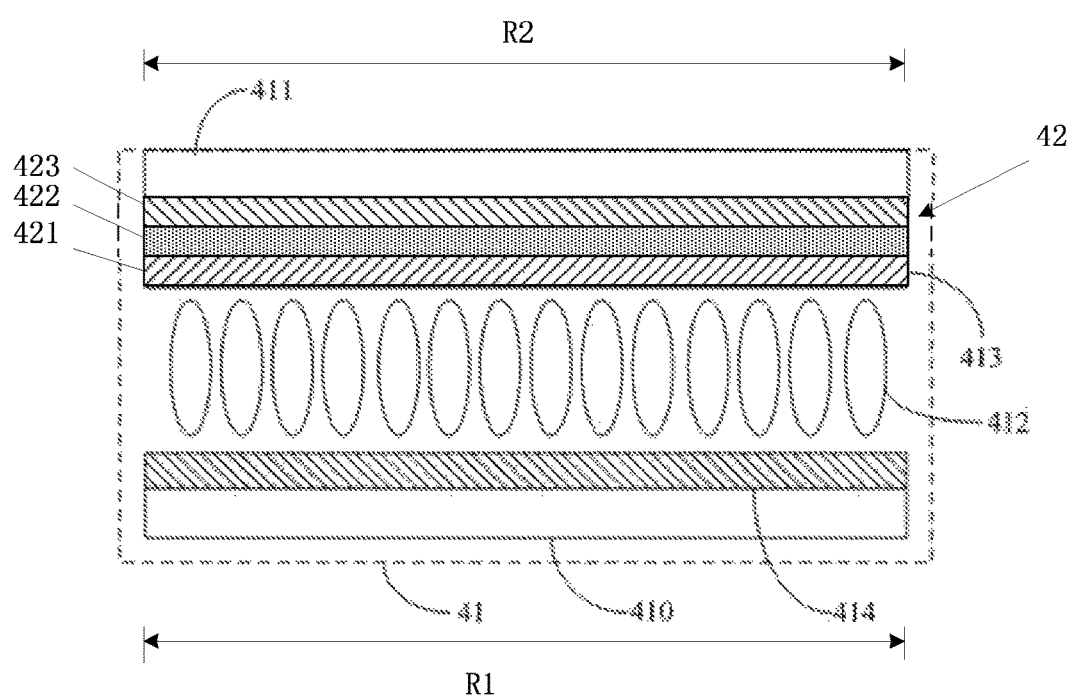
FIG. 5B is a schematic view illustrating a structure of a display device according to an embodiment of the present disclosure.

In another example, as illustrated in FIG. 5B, the electroluminescent display unit 42 is located between the first substrate 411 and the liquid crystal display layer. For example, the driving electrode 413 of the reflective liquid crystal display unit 41 and the first electrode 421 of the electroluminescent display unit 42 are the same electrode. In this way, the device structure can be simplified and the manufacturing cost can be reduced. It can be understood that although not illustrated, in another example, the driving electrode 413 of the reflective liquid crystal display unit 41 and the first electrode 421 of the electroluminescent display unit 42 can be different electrodes, and an insulation layer can be provided therebetween.

Referring to FIG. 5A again, the display device can further include a control unit C configured to selectively control the reflective liquid crystal display unit 41 and the electroluminescent display unit 42 to display. The control unit C is electrically connected to the reflective liquid crystal display unit 41 and the electroluminescent display unit 42.

Referring to FIG. 5A again, the display device can further include an ambient light detection unit S configured to acquire a light intensity data signal of ambient light received by the display device. The control unit is further configured to selectively control the reflective liquid crystal display unit and the electroluminescent device 42 to display according to the light intensity data signal. The ambient light detection unit S is electrically connected to the control unit C.

For example, the control unit C is further configured to control the reflective liquid crystal display unit 41 and the electroluminescent display unit 42 to display at the same time in a case that the light intensity data signal is less than a first predetermined value, and the display light emitted from the electroluminescent display unit 42 has a first brightness. In the case that the light intensity data signal is greater than a first predetermined value, the control unit C is further configured to control display light emitted from the electroluminescent display unit to have a second brightness. The second brightness is less than the first brightness. For example, the first predetermined value is less than or equal to the second predetermined value.

For example, the control unit C is further configured to control the electroluminescent display unit 42 not to display in a case that the light intensity data signal is greater than a first predetermined value, so that the second brightness is substantially zero.

Here, the first predetermined value is less than or equal to the second predetermined value.

It can be understood that, although the control unit C and the ambient light detection unit S are not illustrated in the drawings of other embodiments of the present disclosure, the control unit C and the ambient light detection unit S can be similarly disposed in other display device provided by the embodiment.

For example, the ambient light detection unit S can include a photoelectric conversion device.

The control unit C can be a circuit board or a combination of a plurality of circuit boards for implementing the functions described above. In an embodiment of the present disclosure, the circuit board or the combination of more circuit boards can include: (1) one or more processors; (2) one or more non-transitory computer-readable memories connected to the processor; and (3) processor-executable firmware stored in memory.

Figure 6:
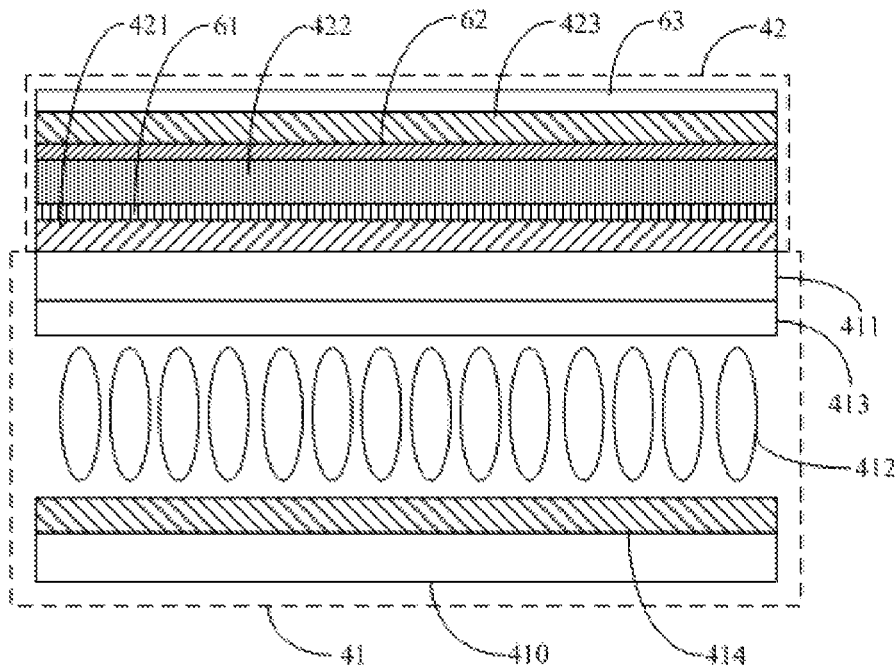
FIG. 6 is a schematic view illustrating a structure of another display device provided by an embodiment of the present disclosure.

For example, as illustrated in FIG. 6, in an embodiment of the present disclosure, the organic electroluminescent display unit further includes a hole transport or injection layer 61 located between the first electrode 421 and the organic light-emitting layer 422, and/or electron transport or injection layer 62 located between the light-emitting layer 422 and the second electrode 423. Only the case where the hole transport or injection layer 61 and the electron transport or injection layer 62 are provided at the same time is illustrated in the figure. There is no limit on the configuration manner of the hole transport or injection layer and the electron transport or injection layer, which will not be described here.

Further, in order to better protect the organic electroluminescent display unit, as illustrated in FIG. 6, the display device provided by an embodiment of the present disclosure further includes an encapsulation cover plate 63 disposed on the second electrode 423 and configured to protect the organic electroluminescent display unit.

Figure 7:
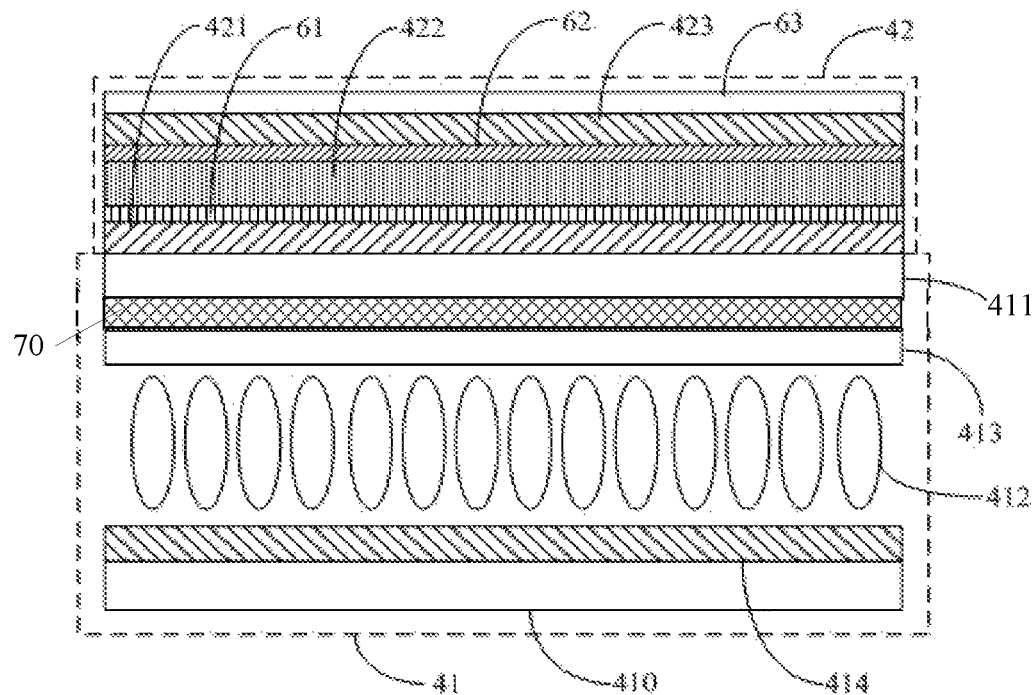
FIG. 7 is a schematic view illustrating a structure of still another display device according to an embodiment of the present disclosure.

For example, as illustrated in FIG. 7, in an embodiment of the present disclosure, a color filter layer 70 is disposed on a side of the first substrate 411 closer to the liquid crystal molecules 412; and the organic electroluminescent display unit 42 is configured to emit light with substantially the same color of the color filter layer 70. For example, the color filter layer 70 is a red color filter layer, and the organic electroluminescent display unit is configured to emit red light. Here, it can be understood that, the organic electroluminescent display unit configured to emit light of a certain color can be that an light-emitting layer of the organic electroluminescent display unit directly emits light of this color, and can also be that light directly emitted from an light-emitting layer of an organic electroluminescent display unit filtered by another color filter layer to emit light of this color. Here, the color of the color filter layer 70 is not limited, and for example, it can be blue, yellow, green, or the like.

In an embodiment of the present disclosure, the second display unit is a bottom-emitting organic electroluminescent display unit.

Figure 8:
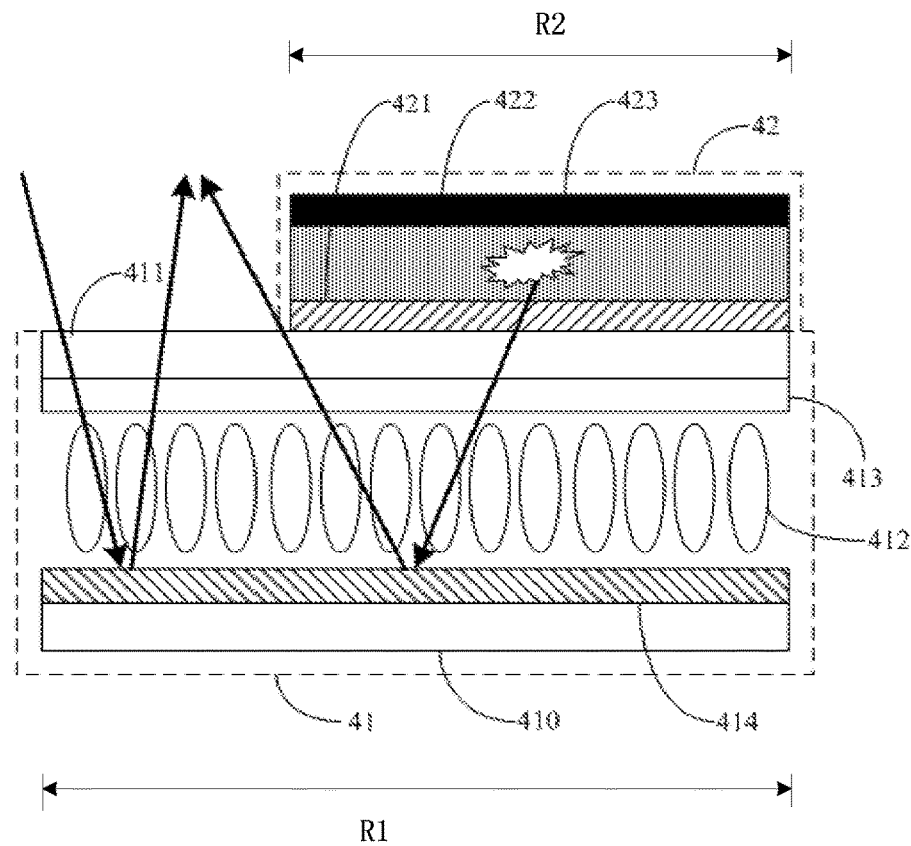
FIG. 8 is a schematic view illustrating a structure of a display device according to an embodiment of the present disclosure.

As illustrated in FIG. 8, in an embodiment of the present disclosure, the first electrode 421 is a transparent electrode, and the second electrode 423 is a non-transparent electrode. For example, a material of the first electrode 421 can be a single-layer film material of ITO or IZO, or a composite film material of ITO and IZO. In the actual production process, other types of transparent conductive materials can also be selected. A material of the second electrode 423 can be selected from a metal material, such as selected from at least one selected from the group consisting molybdenum (Mo), copper (Cu), aluminum (Al), etc.; and combination thereof. The embodiments of the present disclosure do not limit the specific materials of the first electrode and the second electrode.

In the present embodiment, at least a portion of the reflective display region R1 of the reflective liquid crystal display unit 41 is uncovered by the light-emitting display region R2 of the electroluminescent display unit 42.

As illustrated in FIG. 8, in an embodiment of the present disclosure, an area size of an orthographic projection of the first electrode 421 on the first substrate 411 is less than an area size of the first substrate 411, and an area size of an orthographic projection of the second electrode 423 on the first substrate 411 is less than the area size of the first substrate 411. The area sizes of the first electrode 421 and the second electrode 423 are set according to actual production needs.

In the embodiment of the present disclosure, due to the non-transparency of the bottom emitting organic electroluminescent display unit, at least a portion of the reflective display region R1 of the reflective liquid crystal display unit 41 is uncovered by the light-emitting display region of the electroluminescent display unit 42 so as to allow an external light to enter the first display unit 41 at least through the uncovered portion, thereby effectively converting the external light, so as to reduce the power consumption and eliminate the problem which is unfavorable for human eyes to identify caused by over bright of the external light.

As illustrated in FIG. 8, when the display device is placed in an indoor environment, because the ambient light is weak, the light emitted from the organic electroluminescent display unit is adopted as a main display light source, and the external light is adopted as an auxiliary display light source. When the display device is placed in an outdoor environment, because the light of the external environment is strong in this case, the light emitted from the organic electroluminescent display unit is adopted as an auxiliary display light source, and the external light is adopted as a main display light source. In this way, the embodiments of the present disclosure can effectively utilize the strong light from the outside and reduce the power consumption of the display device. At the same time, issues for human eye's difficulty in identifying caused by strong external light can be solved, and power can be saved compared with in the indoor environment. The direction of the arrow in FIG. 8 refers to a light travelling direction.

Figure 9:
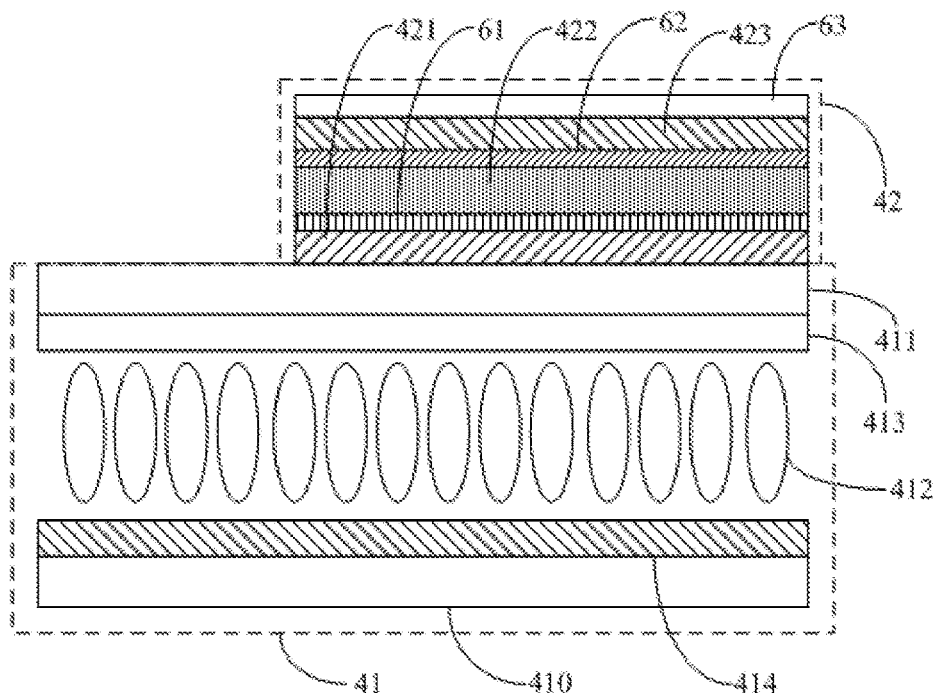
FIG. 9 is a schematic view illustrating a structure of another display device according to an embodiment of the present disclosure.

For example, as illustrated in FIG. 9, in an embodiment of the present disclosure, the organic electroluminescent display unit further includes a hole transport or injection layer 61 disposed between the first electrode 421 and the organic light-emitting layer 422, and/or an electron transport or injection layer 62 disposed between the light-emitting layer 422 and the second electrode 423. Only the case where the hole transport or injection layer 61 and the electron transport or injection layer 62 are provided at the same time is illustrated in the figure.

Further, in order to better protect the organic electroluminescent display unit, as illustrated in FIG. 9, in an embodiment of the present disclosure, the display device further includes an encapsulation cover plate 63 disposed on the second electrode 423 and configured to protect the organic electroluminescent display unit.

Figure 10:
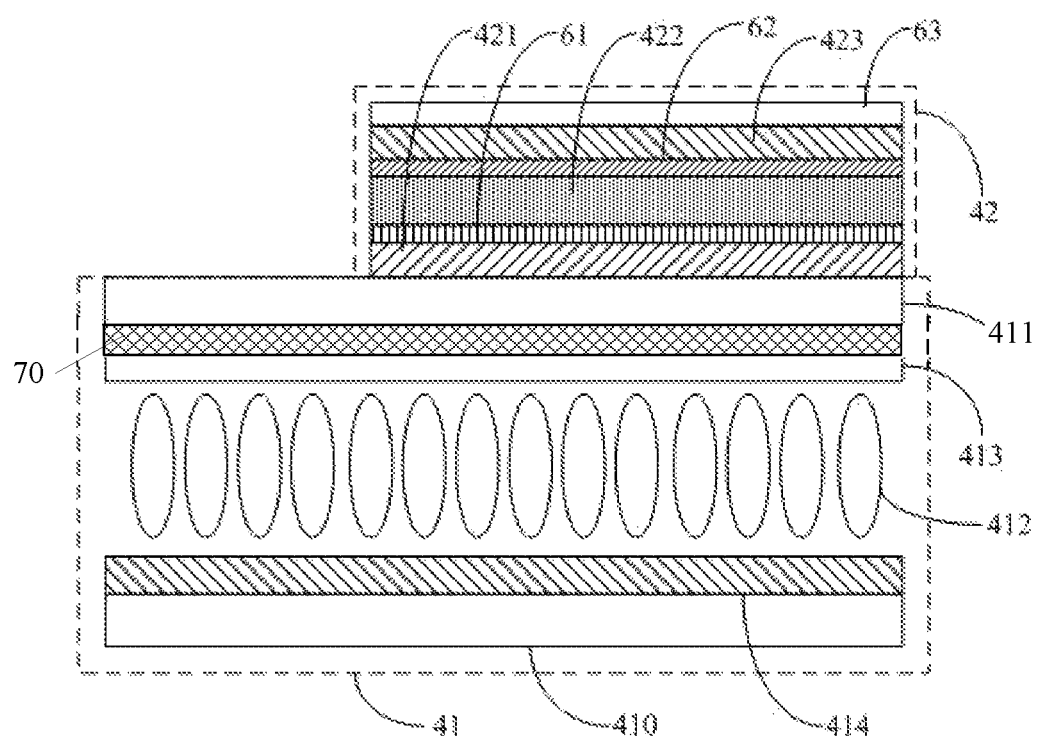
FIG. 10 is a schematic view illustrating a structure of still another display device according to an embodiment of the present disclosure.

For example, as illustrated in FIG. 10, in an embodiment of the present disclosure, a color filter layer 70 is disposed on a side of the first substrate 411 closer to the liquid crystal molecules 412; and the organic electroluminescent display unit is configured to emit a light of a color substantially the same as a color of the color filter layer 70. For example, the color filter layer 70 is a red color filter layer, and the organic electroluminescent display unit is configured to emit red light. Here, it can be understood that, the organic electroluminescent display unit configured to emit light of a certain color can be that an light-emitting layer of the organic electroluminescent display unit directly emits light of this color, and can also be that light directly emitted from an light-emitting layer of an organic electroluminescent display unit filtered by another color filter layer to emit light of this color. Here, the color of the color filter layer 70 is not limited, and for example, it can be blue, yellow, green, or the like.

In the embodiment of the present disclosure, the second display unit is a top-emitting organic electroluminescent display unit.

Figures 11, 12:
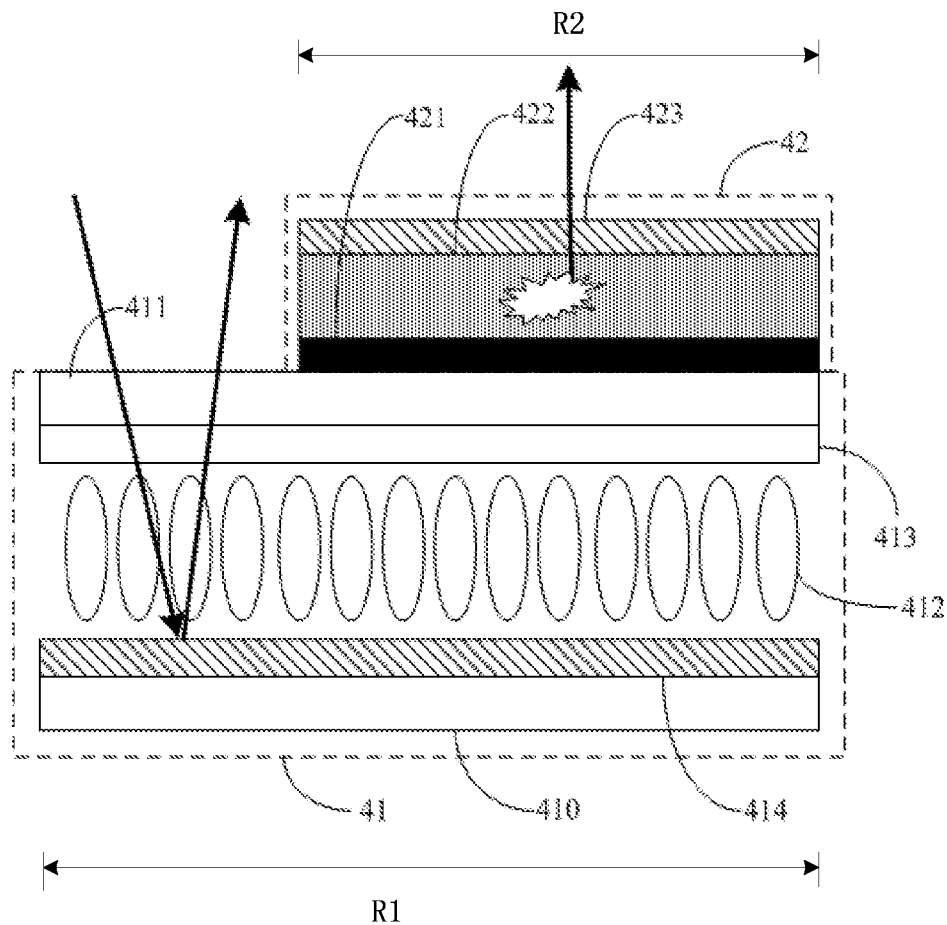
FIG. 11 is a schematic view illustrating a structure of a display device according to an embodiment of the present disclosure.
FIG. 12 is a flowchart of a driving method of a display device according to an embodiment of the present disclosure.

As illustrated in FIG. 11, in an embodiment of the present disclosure, the first electrode 421 is a non-transparent electrode, and the second electrode 423 is a transparent electrode. For example, a material of the second electrode 423 can be a single-layer film material of ITO or IZO, or a composite film material of ITO and IZO. In the actual production process, other types of transparent conductive materials can also be selected. A material of the first electrode 421 can be selected from a metal material, such as from at least one selected from the group consisting molybdenum (Mo), copper (Cu), and aluminum (Al), etc., and combination thereof. The embodiments of the present disclosure do not limit the specific materials of the first electrode and the second electrode.

As illustrated in FIG. 11, in an embodiment of the present disclosure, an area size of an orthographic projection of the first electrode 421 on the first substrate 411 is less than an area size of the first substrate 411, and an area size of an orthographic projection of the second electrode 423 on the first substrate 411 is less than an area size of the first substrate 411. The area size of the first electrode 421 and the second electrode 423 in the embodiments of the present disclosure can be set according to actual production needs. In an embodiment of the present disclosure, because the top-emitting organic electroluminescent display unit is non-transparent, the area size of the organic electroluminescent display unit is less than the area size of the first display unit 41 so as to allow the external light to enter the first display unit 41, thereby effectively converting the external light, so as to reduce the power consumption and eliminate issues which is unfavorable to the human eyes to identify caused by over bright of the external light.

As illustrated in FIG. 11, when the display device is placed in an indoor environment, because the ambient light is weak, the light emitted from the organic electroluminescent display unit is adopted as a main display light source, and the external light is adopted as an auxiliary display light source. When the display device is placed in an outdoor environment, because the light of the external environment is strong in this case, the light emitted from the organic electroluminescent display unit is adopted as an auxiliary display light source, and the external light is adopted as a main display light source. In this way, the embodiments of the present disclosure can effectively utilize the strong light from the outside and reduce the power consumption of the display device. At the same time, issues for human eye's difficulty in identifying caused by strong external light can be solved, and power can be saved compared with in the indoor environment. The direction of the arrow in FIG. 11 refers to a light travelling direction.

For example, in an embodiment of the present disclosure, the organic electroluminescent display unit further includes a hole transport or injection layer 61 disposed between the first electrode 421 and the organic light-emitting layer 422, and/or electron transport or injection layer 62 disposed between the light-emitting layer 422 and the second electrode 423. Only the case where the hole transport or injection layer 61 and the electron transport or injection layer 62 are provided at the same time is illustrated in the figure. The arrangement of the hole transport or injection layer 61 and the transport or injection layer 62 can refer to FIG. 9.

Further, in order to better protect the organic electroluminescent display unit, in an embodiment of the present disclosure, the display device further includes an encapsulation cover plate 63 disposed on the second electrode 423 configured to protect the organic electroluminescent display unit.

For example, in an embodiment of the present disclosure, a color filter layer 70 is disposed on a side of the first substrate 411 closer to the liquid crystal molecules 412; and the organic electroluminescent display unit is configured to emit a light of a color substantially the same as a color of the color filter layer 70. For example, the color filter layer 70 is a red color filter layer, and the organic electroluminescent display unit is configured to emit red light, as illustrated in FIG. 10. Here, it can be understood that, the organic electroluminescent display unit configured to emit light of a certain color can be that an light-emitting layer of the organic electroluminescent display unit directly emits light of this color, and can also be that light directly emitted from an light-emitting layer of an organic electroluminescent display unit filtered by another color filter layer to emit light of this color. Here, the color of the color filter layer 70 is not limited, and for example, it can be blue, yellow, green, or the like.

In the drawings of the above embodiments of the present application, only a schematic view of the structure of one sub-pixel is indicated. Those skilled in the art can understand that other sub-pixels of the display device can have a similar structure.

Based on the same inventive concept, an embodiment of the present disclosure further provides a driving method of the above display device, including:

under illumination of a first ambient light, controlling the reflective liquid crystal display unit and the electroluminescent display unit to display simultaneously, and the display light emitted from the electroluminescent display unit having a first brightness; and under illumination of a second ambient light, controlling the electroluminescent display unit not to work or to emit display light with a second brightness, a light intensity of the first ambient light being less than a light intensity of the second ambient light.

As illustrated in FIG. 12, the driving method provided in this embodiment includes:

S1201: In an indoor environment, controlling the first display unit to work and controlling the second display unit to work;

S1202: In an outdoor environment, controlling the first display unit to work and controlling the second display unit to work or not.

For example, a light intensity of the first ambient light illuminated onto the display device in the indoor environment is less than a light intensity of the second ambient light illuminated onto the display device in the outdoor environment.

When the display device in an embodiment of the present disclosure is placed in an outdoor environment, because the outdoor light is strong, the light intensity of the display light emitted from the second display unit can be reduced in this case. For example, the second display unit is directly controlled to not emit light. In this case, the intensity of light emitted from the second display unit is substantially zero.

For example, in an embodiment of the present disclosure, the second display unit is an organic electroluminescent display unit, and the organic electroluminescent display unit is operated in an active driving mode or in a passive driving mode.

In summary, an embodiment of the present disclosure provides a display device including a first display unit and a second display unit located on the first display unit. The first display unit includes an array substrate and a first substrate disposed opposite to each other, and liquid crystal molecules located between the array substrate and the first substrate, a transparent electrode located on a side of the first substrate closer to the liquid crystal molecules, and a reflective layer electrode located on a side of the array substrate closer to the liquid crystal molecules. The transparent electrode and the reflective layer electrode are configured to adjust rotation of the liquid crystal molecules. The second display unit includes a first electrode located in a predetermined region of the first substrate away from the liquid crystal molecules, an organic light-emitting layer located on the first electrode, and a second electrode located on the organic light-emitting layer. When the display device in an embodiment of the present disclosure is placed in an indoor environment, because the external light is weak, the display device adopts the second display unit as the main display light source. The external light serves as an auxiliary display light source. The external light is reflected by the reflective layer electrode, and then passes through the liquid crystal molecules with different rotation degrees to display. When the display device in an embodiment of the present disclosure is placed in an outdoor environment, because external light is strong at this time, the external light can be adopted as a main display light source at this time, and the second display unit serves as an auxiliary display light source. The external light is reflected by the reflective layer electrode, and passes through the liquid crystal molecules with different rotation degrees to display. In this way, the external light can be effectively used to reduce the power consumption of the display device, prolong the service life of the display. Simultaneously, unfavorable issues for human eye's difficulty in identifying caused by strong external light can be solved.

It will be apparent to those skilled in the art that various modifications and variations can be made in the present disclosure without departing from the spirit and scope of the disclosure. Thus, if these modifications and variations of the present disclosure fall within the scope of the claims of the present disclosure and their equivalent technologies, the present disclosure also intends to include these modifications and variations.

The above description is merely exemplary embodiments of the present disclosure and is not intended to limit the scope of the present disclosure, and the protection scope of the present disclosure is determined by the appended claims.

What is claimed is:

1. A display device comprising a plurality of sub-pixel units, each of the plurality of sub-pixel units comprising:

a reflective liquid crystal display unit with a reflective display region, including a liquid crystal layer and a reflective layer; and an electroluminescent display unit with a light-emitting display region, the light-emitting display region being overlapped with the reflective display region;

wherein, the reflective layer and the electroluminescent display unit are located on two sides of the liquid crystal layer respectively, wherein at least a portion of the reflective display region of the reflective liquid crystal display unit is uncovered by the light-emitting display region of the electroluminescent display unit.

2. The display device according to claim 1, wherein the reflective liquid crystal display unit further comprises:

a first substrate and a second substrate opposite to each other, wherein the liquid crystal layer is located between the first substrate and the second substrate; and a first driving electrode and a second driving electrode configured to control rotation of liquid crystal molecules in the liquid crystal layer;

wherein the electroluminescent display unit is located on the first substrate and comprises a first electrode, a second electrode, and a light-emitting layer located between the first electrode and the second electrode.

3. The display device according to claim 2, wherein the first substrate is located between the electroluminescent display unit and the liquid crystal layer.

4. The display device according to claim 3, further comprising a cover plate located on a side of the electroluminescent display unit away from the liquid crystal layer.

5. The display device according to claim 2, wherein one of the first electrode and the second electrode of the electroluminescent display unit is a reflective electrode.

6. The display device according to claim 5, wherein the other of the first driving electrode and the second driving electrode of the reflective liquid crystal display unit is a transparent electrode.

7. The display device according to claim 1, wherein the reflective liquid crystal display unit further comprises a first color filter layer, and the electroluminescent display unit is configured to emit light of a first color, and the first color filter layer has the first color.

8. The display device according to claim 1, further comprising a control unit configured to selectively control the reflective liquid crystal display unit and the electroluminescent display unit to display.

9. The display device according to claim 8, further comprising an ambient light detection unit configured to acquire a light intensity data signal of ambient light received by the display device, wherein the control unit is further configured to selectively control the reflective liquid crystal display unit and the electroluminescent display unit to display according to the light intensity data signal.

10. The display device according to claim 9, wherein the control unit is further configured to control the reflective liquid crystal display unit and the electroluminescent display unit to display simultaneously in a case where the light intensity data signal is less than a first predetermined value, display light emitted from the electroluminescent display unit having a first brightness; and control display light emitted from the electroluminescent display unit to have a second brightness in a case where the light intensity data signal is greater than a second predetermined value, the second brightness being less than the first brightness, and the first predetermined value being less than or equal to the second predetermined value.

11. The display device according to claim 10, wherein the second brightness is substantially zero.

12. A driving method of the display device as claimed in claim 1, comprising:

under illumination of a first ambient light, controlling the reflective liquid crystal display unit and the electroluminescent display unit to display simultaneously, and display light emitted from the electroluminescent display unit having a first brightness; and under illumination of a second ambient light, controlling the electroluminescent display unit not to work or to emit display light with a second brightness, wherein, a light intensity of the first ambient light is less than a light intensity of the second ambient light.

13. The driving method according to claim 12, wherein the second brightness is less than the first brightness, and the second brightness is substantially not zero.

14. The driving method according to claim 11, wherein the first ambient light is indoor ambient light and the second ambient light is indoor ambient light.

15. The display device according to claim 2, wherein the first substrate is located between the electroluminescent display unit and the liquid crystal layer.

16. The display device according to claim 15, further comprising a cover plate located on a side of the electroluminescent display unit away from the liquid crystal layer.

* * * * *